(12) United States Patent
Zeng et al.

(10) Patent No.: US 10,208,156 B2
(45) Date of Patent: Feb. 19, 2019

(54) EPOXY RESIN COMPOSITION, PREPREG AND LAMINATE USING SAME

(71) Applicant: SHENGYI TECHNOLOGY CO., LTD., Dongguan, Guangdong (CN)

(72) Inventors: Xianping Zeng, Dongguan (CN); Liexiang He, Dongguan (CN); Yongjing Xu, Dongguan (CN)

(73) Assignee: SHENGYI TECHNOLOGY CO., LTD., Dongguan (CN)

( * ) Notice: Subject to any disclaimer, the term of this patent is extended or adjusted under 35 U.S.C. 154(b) by 143 days.

(21) Appl. No.: 15/113,618

(22) PCT Filed: Jun. 1, 2015

(86) PCT No.: PCT/CN2015/080535
§ 371 (c)(1),
(2) Date: Jul. 22, 2016

(87) PCT Pub. No.: WO2016/101538
PCT Pub. Date: Jun. 30, 2016

(65) Prior Publication Data
US 2017/0002131 A1 Jan. 5, 2017

(30) Foreign Application Priority Data
Dec. 26, 2014 (CN) .......................... 2014 1 0831488

(51) Int. Cl.
| | | |
|---|---|---|
| *C08G 59/06* | (2006.01) |
| *C08G 59/42* | (2006.01) |
| *C08G 59/32* | (2006.01) |
| *C08G 73/10* | (2006.01) |
| *C08L 63/00* | (2006.01) |
| *C08L 79/00* | (2006.01) |
| *C08K 3/013* | (2018.01) |
| *C08K 3/36* | (2006.01) |
| *C08K 5/00* | (2006.01) |
| *C08K 5/11* | (2006.01) |
| *C08J 5/24* | (2006.01) |
| *H05K 1/03* | (2006.01) |
| *B32B 27/04* | (2006.01) |

(52) U.S. Cl.
CPC ....... *C08G 59/063* (2013.01); *C08G 59/3236* (2013.01); *C08G 59/4215* (2013.01); *C08G 73/1071* (2013.01); *C08J 5/24* (2013.01); *C08K 3/013* (2018.01); *C08K 3/36* (2013.01); *C08K 5/0025* (2013.01); *C08K 5/0066* (2013.01); *C08K 5/11* (2013.01); *C08L 63/00* (2013.01); *C08L 79/00* (2013.01); *H05K 1/0373* (2013.01); *B32B 27/04* (2013.01); *C08J 2363/02* (2013.01); *H05K 1/0326* (2013.01); *H05K 2201/012* (2013.01); *H05K 2201/0209* (2013.01); *H05K 2201/0212* (2013.01)

(58) Field of Classification Search
None
See application file for complete search history.

(56) References Cited

U.S. PATENT DOCUMENTS

| | | | |
|---|---|---|---|
| 4,927,736 A | 5/1990 | Mueller et al. |
| 9,873,789 B2 | 1/2018 | Zeng et al. |
| 2010/0227090 A1 | 9/2010 | Liao et al. |
| 2011/0235292 A1 | 9/2011 | Jung et al. |
| 2012/0043508 A1* | 2/2012 | Hirai ........................ B32B 7/12 |
| | | | 252/512 |
| 2012/0136094 A1 | 5/2012 | Chen et al. |
| 2013/0161080 A1 | 6/2013 | Lin |
| 2014/0342161 A1 | 11/2014 | Zeng |
| 2017/0009074 A1 | 1/2017 | Xi et al. |
| 2018/0016387 A1 | 1/2018 | Xu et al. |

FOREIGN PATENT DOCUMENTS

| | | |
|---|---|---|
| CN | 1680375 A | 10/2005 |
| CN | 1989203 A | 6/2007 |
| CN | 101244645 A | 8/2008 |
| CN | 101831051 A | 9/2010 |
| CN | 102051022 A | 5/2011 |
| CN | 102134375 A | 7/2011 |
| CN | 102206397 A | 10/2011 |
| CN | 102399415 A | 4/2012 |

(Continued)

OTHER PUBLICATIONS

Liu, Jia "Synthesis and Properties of Novel Heat Resistant, Halogen-Free Flame Retardant Epoxy Resin," Science-Engineering (A), China Master Thesis Full Text Database, vol. / No. 06 Jun. 15, 2013, pp. B016-B161.

(Continued)

*Primary Examiner* — Randy P Gulakowski
*Assistant Examiner* — Ha S Nguyen
(74) *Attorney, Agent, or Firm* — McCartre & English, LLP; Steven G. Davis; We Song

(57) ABSTRACT

Provided in the present invention are an epoxy resin composition, prepreg and laminate using the same, the epoxy resin composition comprising the following components: (A) an imide modified epoxy resin; and (B) a crosslinking agent, the imide modified epoxy resin being an epoxy resin having a structure of formula (1) and/or formula (2). The prepreg and laminate prepared from the epoxy resin composition have a high glass-transition temperature, a low dielectric constant, a low dielectric loss factor, a high heat and humidity resistance, a high toughness and a good processability.

22 Claims, No Drawings

(56) References Cited

FOREIGN PATENT DOCUMENTS

| | | |
|---|---|---|
| CN | 102516541 A | 6/2012 |
| CN | 102558858 A | 7/2012 |
| CN | 102732029 A | 10/2012 |
| CN | 102850545 A | 1/2013 |
| CN | 102858839 A | 1/2013 |
| CN | 102977551 A | 3/2013 |
| CN | 103265791 A | 8/2013 |
| CN | 103382242 A | 11/2013 |
| CN | 103421273 A | 12/2013 |
| CN | 103834168 A | 6/2014 |
| CN | 103992621 A | 8/2014 |
| CN | 104592467 A | 5/2015 |
| CN | 105295041 A | 2/2016 |
| CN | 105440263 A | 3/2016 |
| CN | 105482076 A | 4/2016 |
| EP | 0113575 A1 | 7/1984 |
| EP | 2770024 A1 | 8/2014 |
| EP | 2896654 A1 | 7/2015 |
| JP | S61167684 A | 7/1986 |
| JP | H01319528 A | 12/1989 |
| JP | H11052567 A | 2/1999 |
| JP | 2000186133 A | 7/2000 |
| JP | 2001348420 A | 12/2001 |
| JP | 2003231753 A | 8/2003 |
| JP | 2003-252958 A | 9/2003 |
| JP | 2010053070 A | 3/2010 |
| JP | 2010053071 A | 3/2010 |
| JP | 2011173827 A | 9/2011 |
| JP | 2014-132074 A | 7/2014 |
| KR | 10-2011-0048049 A | 5/2011 |
| KR | 10-2012-0079986 A | 7/2012 |
| KR | 10-2013-0125384 A | 11/2013 |
| WO | 0037442 A1 | 6/2000 |
| WO | 2011/059633 A2 | 5/2011 |
| WO | 2012124780 A1 | 9/2012 |
| WO | 2014/076024 A1 | 5/2014 |
| WO | 2015127860 A1 | 9/2015 |
| WO | 2015/179232 A1 | 11/2015 |
| WO | 2016/101538 A1 | 6/2016 |
| WO | 2016101540 A1 | 6/2016 |

OTHER PUBLICATIONS

Australian Office Action for Application No. 2016247084, dated Apr. 19, 2017. 9 pages.
International Search Report for Application No. PCT/CN2016/077730, dated Jun. 30, 2016. 4 pages.
Supplementary European Search Report for Application No. 16785078.3, dated Dec. 7, 2017. 6 pages.
Supplementary European Search Report for Application No. 15864296.7, dated Jul. 27, 2017. 6 pages.
U.S. Appl. No. 15/188,204, filed Aug. 11, 2016, U.S. Pat. No. 9,873,789, Issued.
U.S. Appl. No. 15/120,549, filed Aug. 22, 2016, US 2017-0009074, Published.
U.S. Appl. No. 15/305,759, filed Oct. 21, 2016, US-2018-0016387, Published.

* cited by examiner

EPOXY RESIN COMPOSITION, PREPREG AND LAMINATE USING SAME

CROSS-REFERENCE TO RELATED APPLICATIONS

This application is a 35 U.S.C. § 371 national stage filing of International Application No. PCT/CN2015/080535, filed Jun. 1, 2015, which claims priority to Chinese Patent Application No. 201410831488.2, filed Dec. 26, 2014. The entire contents of each of the aforementioned applications are incorporated herein by reference.

TECHNICAL FIELD

The present invention belongs to the technical field of copper clad laminates, specifically an epoxy resin composition, prepregs, laminates and printed circuit boards using the same.

BACKGROUND ART

In recent years, signal operation tends to high frequency for high speed transmission and large-capacity information processing with the development of high performance, high function and networking of information communication equipments. Meanwhile, in order to meet the requirement trends of various kinds of electronic products, circuit boards are developed in the direction of high multilayer and high wiring density. This requires that the substrate materials shall have not only better dielectric properties to meet the demands on high frequency transmission of signals, but also better heat resistance and mechanical processability to meet the demands on reliability and processability of multilayer printed circuit boards.

Polyimide is one of the organic polymer materials having the best overall performances and it has high temperature resistance to higher than 400° C. However, it has a low solubility and a hard processability.

Bismaleimide (BMI) is another type of resin system derived from polyimide resin system and is a bifunctional compound using maleimide as active end groups, which overcomes the defect that epoxy resins have a relatively lower heat resistance, but still has problems of low solubility, being easy to phase separation and high curing temperature.

CN101831051 discloses an epoxy resin containing naphthalene ring, dicyclopentadiene ring and imide structures. However, there contains a higher content of naphthalene ring, and pyromellitic dianhydride having a worse solubility, the epoxy resin has a high brittleness, a worse solubility and is easy to having a phase separation, as well as has a high cost.

DISCLOSURE OF THE INVENTION

As for the problems in the prior art, the object of the present invention lies in providing an epoxy resin composition, as well as prepregs and laminates using the same. The laminates prepared from such epoxy resin composition have a high glass transition temperature, a low dielectric constant, a low dielectric loss factor, a high moisture and heat resistance, a high toughness and a better processability.

In order to achieve the aforesaid object, the present inventor conducted extensive studies and found that the composition obtained by suitably mixing imide-modified epoxy resin and crosslinking agent, and other optional components may achieve the aforesaid object.

An epoxy resin composition, comprising:
(A) imide-modified epoxy resin;
(B) crosslinking agent;
wherein the imide-modified epoxy resin is an epoxy resin having formula (1) and/or (2),

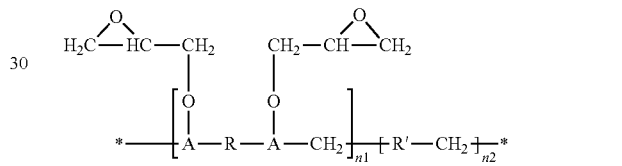

Formula (1)

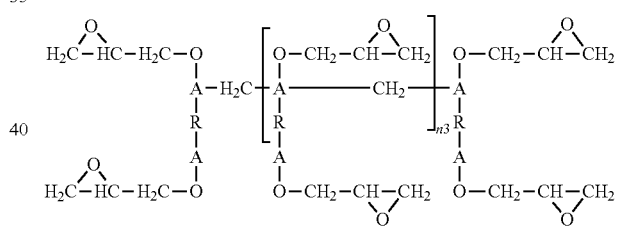

Formula (2)

A in Formulae (1) and (2) is independently unsubstituted phenyl or C1-C4 alkyl-substituted phenyl; A in Formulae (1) and (2) can be the same or different; $n_1$, $n_2$ and $n_3$ all are independently integers which is greater than or equals to 1;

R in Formulae (1) and (2) is independently

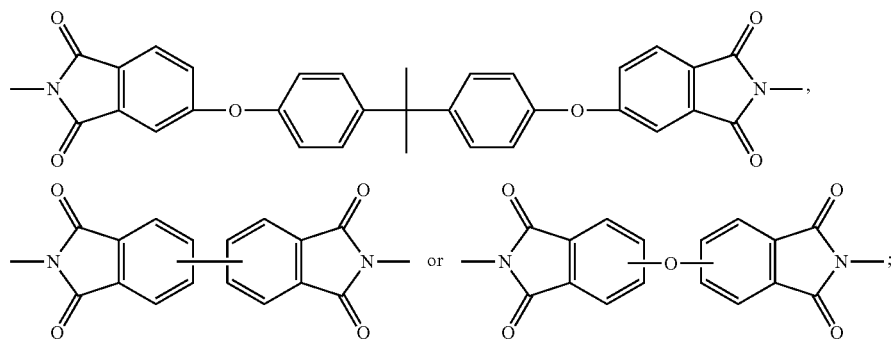

in Formula (1), R' is

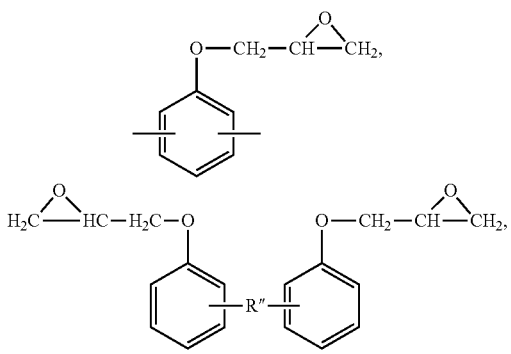

wherein R" is a single bond,

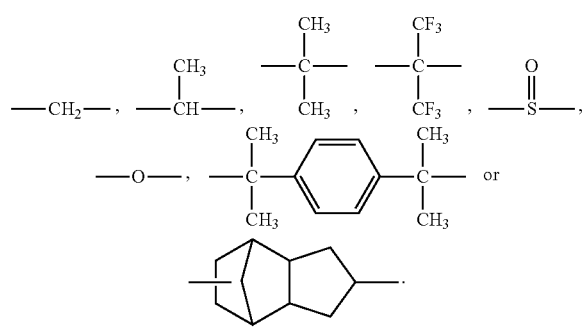

Preferably, the imide-modified epoxy resin is an epoxy resin having formula (2).

Further preferably, the imide-modified epoxy resin is an epoxy resin having the following structure and having both heat resistance and toughness, The imide-modified epoxy resin of the present invention has good solubility and processability, and comprises imide structure in the main chain so as to make it have a better glass transition temperature. Thus the addition of imide-modified epoxy resin can notably increase the glass transition temperature and improve the toughness of the cured product.

The present invention makes use of the co-operation and mutual synergistic effect of these essential components, so as to obtain the aforesaid epoxy resin composition. The prepregs and laminates prepared from such epoxy resin composition have a high glass transition temperature, a low dielectric constant, a low dielectric loss factor, a high moist heat resistance, a high toughness and a better processability.

The selection and reasonable collocation of crosslinking agent types can make the composition achieve different performances in the present invention. Preferably, the crosslinking agent is any one selected from the group consisting of active esters, anhydride compounds or novolac resins, or a mixture of at least two selected therefrom.

Preferably, the active esters are the active ester crosslinking agents having the functional ester groups, and anhydride compounds can be anhydride compounds, e.g. styrene maleic anhydride and the like. Novolac resins are the hydroxyl-containing novolac resins selected from the group consisting of linear novolac resin, biphenyl phenolic resin, alkyl novolac resin, DCPD novolac resin or TCPD novolac resin.

Further preferably, the crosslinking agent is active esters or/and anhydride compounds, and has better dielectric properties when reacting with epoxy resin.

More preferably, the crosslinking agent is the active esters having the following structures. Due to the specific structure of such active ester, the rigid structures therein, such as phenyl, naphthyl, cyclopentadiene and so on, endow such active ester with high heat resistance. Meanwhile, the structural regularity thereof and no production of secondary hydroxyl during the reaction with epoxy resin endow with better electrical performance and low water absorption.

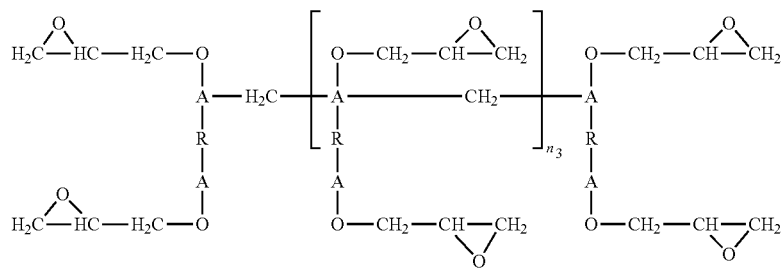

wherein A is phenyl; R is

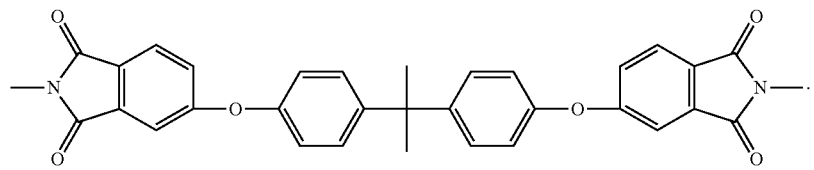

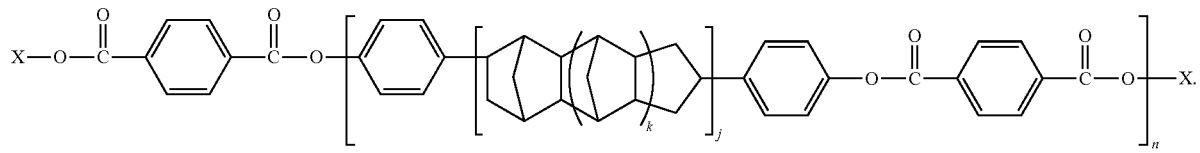

X is phenyl or naphthyl; j is 0 or 1; k is 0 or 1; n represents that the repeating unit is 0.25-1.25.

Preferably, the ratio of the epoxy equivalent of the imide-modified epoxy resin to the active group equivalent in the crosslinking agent is 1:0.9-1.1.

When the crosslinking agent is active ester, the ratio of the epoxy equivalent of the imide-modified epoxy resin to the ester equivalent of the active ester in the crosslinking agent is 1:0.9-1.1, e.g. 1:10.92, 1:0.94, 1:0.96, 1:0.98, 1:1, 1:1.02, 1:1.04, 1:1.06 or 1:1.08. When the crosslinking agent is anhydride compound, the ratio of the epoxy equivalent of the imide-modified epoxy resin to the anhydride equivalent of the anhydride compound in the crosslinking agent is 1:0.9-1.1, e.g.1:10.92, 1:0.94, 1:0.96, 1:0.98, 1:1, 1:1.02, 1:1.04, 1:1.06 or 1:1.0. When the crosslinking agent is novolac resin, the ratio of the epoxy equivalent of the imide-modified epoxy resin to the hydroxyl equivalent of the novolac resin in the crosslinking agent is 1:0.9-1.1, e.g.1:10.92, 1:0.94, 1:0.96, 1:0.98, 1:1, 1:1.02, 1:1.04, 1:1.06 or 1:1.08.

When the crosslinking agent is active ester and anhydride compound, the ratio of the epoxy equivalent of the imide-modified epoxy resin to the sum of the ester equivalent of the active ester and the anhydride equivalent of the anhydride compound in the crosslinking agent is 1:0.9-1.1, e.g.1:10.92, 1:0.94, 1:0.96, 1:0.98, 1:1, 1:1.02, 1:1.04, 1:1.06 or 1:1.08. When the crosslinking agent is active ester and novolac resin, the ratio of the epoxy equivalent of the imide-modified epoxy resin to the sum of the ester equivalent of the active ester and the hydroxyl equivalent of the novolac resin in the crosslinking agent is 1:0.9-1.1, e.g.1:10.92, 1:0.94, 1:0.96, 1:0.98, 1:1, 1:1.02, 1:1.04, 1:1.06 or 1:1.08. When the crosslinking agent is anhydride compound and novolac resin, the ratio of the epoxy equivalent of the imide-modified epoxy resin to the sum of the anhydride equivalent of the anhydride compound and the hydroxyl equivalent of the novolac resin in the crosslinking agent is 1:0.9-1.1, e.g.1:10.92, 1:0.94, 1:0.96, 1:0.98, 1:1, 1:1.02, 1:1.04, 1:1.06 or 1:1.08. When the crosslinking agent is active ester, anhydride compound and novolac resin, the ratio of the epoxy equivalent of the imide-modified epoxy resin to the sum of the ester equivalent of the active ester, the anhydride equivalent of the anhydride compound and the hydroxyl equivalent of the novolac resin in the crosslinking agent is 1:0.9-1.1, e.g.1:10.92, 1:0.94, 1:0.96, 1:0.98, 1:1, 1:1.02, 1:1.04, 1:1.06 or 1:1.08.

Preferably, the epoxy resin composition further comprises a curing accelerator which cures the resin and speeds up the curing rate of resins. Based on the sum of the addition amounts of components (A) and (B) which is 100 parts by weight, the curing accelerator is added in an amount of 0.05-1 part by weight, e.g. 0.08, 0.1, 0.15, 0.2, 0.25, 0.3, 0.35, 0.4, 0.45, 0.5, 0.55, 0.60, 0.65, 0.7, 0.75, 0.8, 0.85, 0.9 or 0.95 parts by weight.

Preferably, the curing accelerator is any one selected from the group consisting of 4-dimethylaminopyridine, 2-methylimidazole, 2-methyl-4-ethylimidazole or 2-phenylimidazole, or a mixture of at least two selected therefrom.

Preferably, the epoxy resin composition further comprises a flame retardant which is bromine-containing flame retardant or/and halogen-free flame retardant.

Preferably, the flame retardant is added in an amount of 5-50 parts by weight, based on the sum of the addition amounts of components (A) and (B) which is 100 parts by weight, e.g. 5, 10, 15, 25, 30, 35, 40 or 45 parts by weight.

Preferably, the bromine-containing flame retardant is any one selected from the group consisting of decabrominated diphenyl ethane, brominated polystyrene, ethylene bis-tetrabromo phthalimide and bromine-containing epoxy resin, or a mixture of at least two selected therefrom.

Preferably, the halogen-free flame retardant is any one selected from the group consisting of tri(2,6-dimethylphenyl)phosphine, 10-(2,5-dihydroxyphenyl)-9,10-dihydro-9-oxa-10-phosphaphenanthrene-10-oxide, 2,6-di-(2,6-dimethylphenyl)-pho sphinobenzene, 10-phenyl-9,10-dihydro-9-oxa-10-phosphaphenanthrene-10-oxide, phenoxyphosphazene compound, zinc borate, nitrogen and phosphorus-based intumescent flame retardant, organic polymer flame retardant, phosphorous-containing novolac resin and phosphorous-containing bismaleimide, or a mixture of at least two selected therefrom.

Preferably, the epoxy resin composition further comprises a filler selected from organic fillers or/and inorganic fillers, which is mainly used for adjusting some physical property effects of the composition, e.g. reducing thermal expansion coefficient (CTE) and water absorption and increasing thermal conductivity and the like.

Preferably, the filler is added in an amount of 0-100 parts by weight, excluding 0, preferably 0-50 parts by weight, excluding 0, based on the sum of the addition amounts of components (A) and (B) which is 100 parts by weight, e.g. 0.5, 1, 5, 10, 15, 20, 25, 30, 35, 40, 45, 50, 55, 60, 65, 70, 75, 80, 85, 90 or 95 parts by weight.

Preferably, the inorganic filler is any one selected from the group consisting of molten silica, crystalline silica, spherical silica, hollow silica, aluminium hydroxide, alumina, talc, aluminum nitride, boron nitride, silicon carbide, barium sulfate, barium titanate, strontium titanate, calcium carbonate, calcium silicate, mica or glass fiber powder, or a mixture of at least two selected therefrom. The mixture is selected from the group consisting of a mixture of molten silica and crystalline silica, a mixture of spherical silica of hollow silica, a mixture of aluminium hydroxide and alumina, a mixture of talc and aluminum nitride, a mixture of boron nitride and silicon carbide, a mixture of barium sulfate and barium titanate, a mixture of strontium titanate and calcium carbonate, a mixture of calcium silicate, mica and glass fiber powder, a mixture of molten silica, crystalline silica and spherical silica, a mixture of hollow silica, aluminium hydroxide and alumina, a mixture of talc, aluminum nitride and boron nitride, a mixture of silicon carbide, barium sulfate and barium titanate, and a mixture of strontium titanate, calcium carbonate, calcium silicate, mica and glass fiber powder.

Preferably, the organic filler is any one selected from the group consisting of polytetrafluoroethylene powder, polyphenylene sulfide and polyether sulfone powder, or a mixture of at least two selected therefrom. The mixture is selected from the group consisting of a mixture of polytetrafluoroethylene powder and polyphenylene sulfide, a mixture of polyether sulfone powder and polytetrafluoroethylene powder and a mixture of polytetrafluoroethylene powder, polyphenylene sulfide and polyether sulfone powder.

Preferably, the filler is silica having a moderate particle size of 1-15 μm, preferably 1-10 μm.

The wording "comprise(s)/comprising" in the invention means that, besides said components, there may be other components which endow the epoxy resin composition with different properties. In addition, the wording "comprise(s)/comprising" in the present invention may be replaced with "is/are" or "consist(s)/consisting of" in a close manner.

For example, the epoxy resin composition further comprises various additives, specifically e.g. antioxidants, heat stabilizers, antistatic agents, UV absorbers, pigments, colorants, lubricants and the like. These various additives may be used alone, or in combination.

The conventional process for preparing the resin composition of the present invention comprises: taking a vessel, putting solid components, then adding a liquid solvent, stirring until complete dissolving, adding a liquid resin, a filler, a flame retardant, a curing accelerator, continuing to stir homogeneously, and finally adjusting the solid content of the solution with a solvent to 60-80% to obtain a varnish.

The second object of the present invention lies in providing a prepreg comprising a reinforcing material and the epoxy resin composition as stated above attached thereon after impregnation and drying.

The exemplary reinforcing materials include nonwoven fabrics or/and other fabrics, e.g. natural fibers, organic synthetic fibers and inorganic fibers.

Such varnish is used to impregnate the reinforcing materials, such as fabric or organic fabrics, e.g. glass fabrics. The impregnated reinforcing materials are dried in an oven at 155° C. for 5-10 min to obtain a prepreg.

The third object of the present invention lies in providing a laminate comprising at least one prepreg as stated above.

The fourth object of the present invention lies in providing a printed circuit board comprising at least one prepreg as stated above.

As compared to the prior art, the present invention has the following beneficial effects.

(1) The present invention discloses introducing imide groups having a stronger rigidity into the main chain of epoxy resins, which improves problems of worse solubility, processability and toughness of the current imide resins. At the same time, the imide-modified epoxy resin has a better heat resistance as compared to the current typical epoxy resin.

(2) Prepregs, laminates and metal clad laminates prepared from such epoxy resin have a high glass transition temperature, a low dielectric constant, a low dielectric loss factor, a high moisture and heat resistance, a high toughness and a better processability.

Embodiments

The technical solutions of the present invention are further stated by the following embodiments.

The epoxy resin composition metal-clad laminates were tested for the glass transition temperature, dielectric constant, dielectric loss factor, and PCT and PCT water absorption and toughness thereof, which are detailedly stated and described below, wherein the mass part of the organic resin is based on the mass parts of organic solids.

PREPARATION EXAMPLE 1

Synthesis of the Epoxy Resin of Formula (1)

11 g of aminophenol and 200 g of butanone were added to a round-bottomed flask with a stirrer, a thermometer, a nitrogen gas introduction tube and a reflux condenser, heated in a water bath to speed up the dissolution. Bisphenol A diglycidyl ether dianhydride having a concentration of 20 wt. % (weight percentage) was dropwise added with 130 g of acetone into a reactor. The dropping rate was controlled so as to finish the addition within one hour. The reaction continued at 30° C. for 2 h, and then butanone was removed by evaporation. A mixed solvent of 160 g of DMF and 40 g of toluene was added, and 0.25 g of a catalyst of P-toluenesulfonic acid (P-TSA) was added, to react at 110° C. for 8 h. After the reaction, a part of solvent was removed by evaporation at a reduced pressure. The mixture was then water-washed, filtered, re-crystallized, dried under vacuum to obtain a hydroxyl compound containing benzene ring and imide structures stated as below,

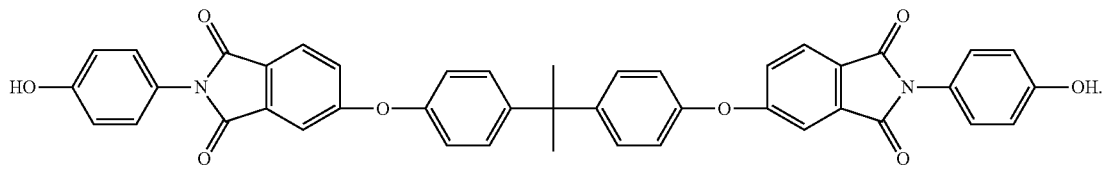

Into a four-necked flask were added 80.2 g of the hydroxyl compound containing benzene ring and imide structures obtained above, 18.6 g of 4,4-dihydroxybiphenyl, 6 g of formaldehyde, 0.25 g of P-toluenesulfonic acid and 250 g of a solvent of methyl isobutyl ketone, reacted at 150 ° C. for 6-8 h. After the reaction, the mixture was water-washed, and the solvent was removed to obtain an intermediate.

Into a four-necked flask was fed 25 g of the intermediate obtained above. 100 g of epichlorohydrin was weighed and slowly added, dissolved and heated. 1 mol of NaOH solution having a mass fraction of 33% was dropwise added to a dropping funnel, the dropping rate was controlled so as to finish the addition within one hour, and the reaction temperature was controlled at 100° C. After dropping, the mixture was maintained at such temperature for 5 h, cooled and water-washed, then heated to 120° C. and evaporated excessive epichlorohydrin. After the reaction, a part of solvent was removed by evaporation at a reduced pressure, and then water-washing, filtering, re-crystallizing and drying under vacuum were carried out to obtain the following epoxy resin,

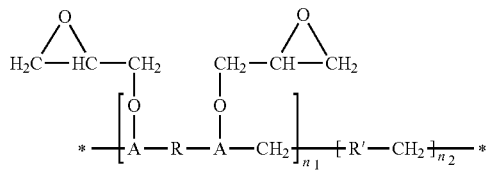

wherein A is benzene ring, R is

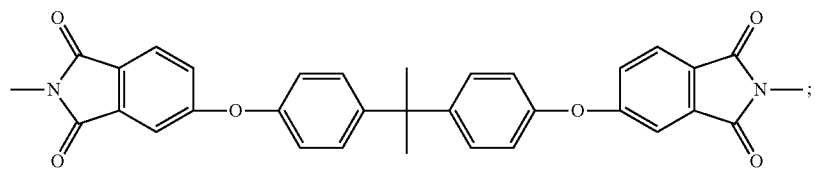

R' is

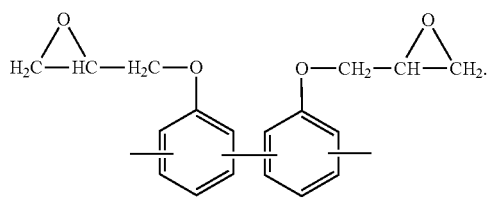

PREPARATION EXAMPLE 2

Synthesis of the Epoxy Resin of Formula (2)

11 g of aminophenol and 200 g of butanone were added to a round-bottomed flask with a stirrer, a thermometer, a nitrogen gas introduction tube and a reflux condenser, heated in a water bath to speed up the dissolution. Bisphenol A diglycidyl ether dianhydride having a concentration of 20 wt. % (weight percentage) was dropwise added with 130 g of butanone into a reactor. The dropping rate was controlled so as to finish the addition within one hour. The reaction continued at 30° C. for 2 h, and then butanone was removed by evaporation. A mixed solvent of 160 g of DMF and 40 g of toluene was added, and 0.25 g of a catalyst of P-toluene-sulfonic acid (P-TSA) was added, to react at 110° C. for 8 h. After the reaction, a part of solvent was removed by evaporation at a reduced pressure. The mixture was then filtered, re-crystallized, dried under vacuum to obtain a hydroxyl compound containing benzene ring and imide structures stated as below,

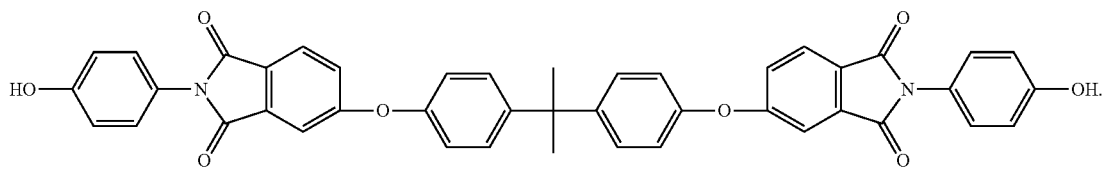 [SMILES: CC(C)(c1ccc(Oc2ccc3c(c2)C(=O)N(c2ccc(O)cc2)C3=O)cc1)c1ccc(Oc2ccc3c(c2)C(=O)N(c2ccc(O)cc2)C3=O)cc1]

Into a four-necked flask were added 80.2 g of the hydroxyl compound containing benzene ring and imide structures obtained above, 6 g of formaldehyde, 0.25 g of P-toluenesulfonic acid and 200 g of a solvent of methyl isobutyl ketone, reacted at 150 ° C. for 6-8 h. After the reaction, the mixture was water-washed, and the solvent was removed to obtain an intermediate.

Into a four-necked flask was fed 25 g of the intermediate obtained above. 150 g of epichlorohydrin was weighed and slowly added, dissolved and heated. 1 mol of NaOH solution having a mass fraction of 33% was dropwise added to a dropping funnel, the dropping rate was controlled so as to finish the addition within one hour, and the reaction temperature was controlled at 100° C. After dropping, the mixture was maintained at such temperature for 5 h, cooled and water-washed, then heated to 120° C. and evaporated excessive epichlorohydrin, so as to obtain the following epoxy resin, nated to each other, and covered with a sheet of copper foil on both sides thereof, placed in a hot press and cured to obtain the epoxy resin copper clad laminates. The physical property data are shown in Table 1.

EXAMPLES 2-6

The preparation processes are the same as that in Example 1, and the composition formulations and the physical indexes are shown in Table 1 below.

COMPARISON EXAMPLES 1-3

The preparation processes are the same as that in Example 1, and the composition formulations and the physical indexes are shown in Table 1 below.

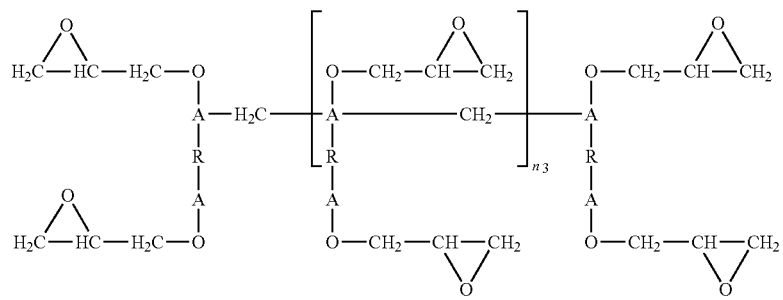

wherein A is benzene ring, and R is

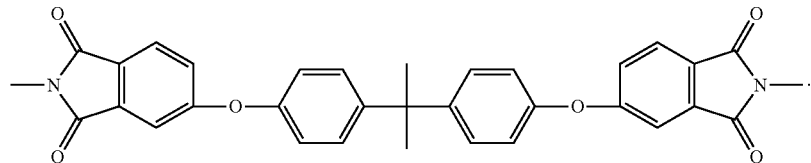

EXAMPLE 1

60 parts by weight of A1 was added into a vessel; a suitable amount of MEK, active ester crosslinking ester HPC-8000-65T, and a suitable amount of curing accelerator 4-dimethylaminopyridine were added and continuously stirred. Finally, a solvent was used to adjust the solid content of the liquid to 60%-80% and to prepare a varnish. A glass fiber cloth was impregnated with the aforesaid varnish to control to an appropriate thickness, then dried to remove solvent and obtain a prepreg. Several prepregs were lami

TABLE 1

| | Composition formulations and physical indexes in each Example | | | | | | |
|---|---|---|---|---|---|---|---|
| | Substances | Example 1 | Example 2 | Example 3 | Example 4 | Example 5 | Example 6 |
| Epoxy resin | A1 | 60 | — | | — | | |
| | A2 | — | 60 | 60 | 60 | 60 | 60 |
| | A3 | | | | | | |
| | NC-3000H | | | | | | |
| | 7200-3H | | | | | | |

TABLE 1-continued

Composition formulations and physical indexes in each Example

| | Substances | Example 1 | Example 2 | Example 3 | Example 4 | Example 5 | Example 6 |
|---|---|---|---|---|---|---|---|
| Crosslinking agent | HPC-8000-65T | 1 eq | | | 1 eq | 0.9 eq | 1.1 eq |
| | EF40 | | 1 eq | | | | |
| | 2812 | | | 1 eq | | | |
| Accelerator | 4-dimethylaminopyridine | q.s. | q.s. | q.s. | q.s. | q.s. | q.s. |
| Performance | $T_g$ (DSC)/° C. | 178 | 195 | 205 | 190 | 187 | 188 |
| | Td (5% loss) | 390 | 400 | 420 | 430 | 425 | 426 |
| | CTE | 2.00% | 1.70% | 1.60% | 1.80% | 1.90% | 1.90% |
| | $D_k$ (10 GHZ) | 3.73 | 3.8 | 3.9 | 3.78 | 3.8 | 3.8 |
| | $D_f$ (10 GHZ) | 0.0065 | 0.0075 | 0.0150 | 0.0068 | 0.0072 | 0.0072 |
| | PCT water absorption | 0.23% | 0.32% | 0.35% | 0.24% | 0.25% | 0.25% |
| | PCT | 0/3 | 0/3 | 0/3 | 0/3 | 0/3 | 0/3 |
| | Phase separation | No | No | No | No | No | No |
| | Toughness | ⊚ | ⊚ | ⊚ | ⊚ | ⊚ | ⊚ |

TABLE 2

Composition formulations and physical indexes in each Comparison Example

| | Substances | Comparison Example 1 | Comparison Example 2 | Comparison Example 3 |
|---|---|---|---|---|
| Epoxy resin | A1 | — | — | — |
| | A2 | — | — | — |
| | A3 | 60 | — | — |
| | NC-3000H | | 60 | |
| | 7200-3H | | | 60 |
| Crosslinking agent | HPC-8000-65T | 1eq | 1eq | 1eq |
| | EF40 | | | |
| | 2812 | | | |
| Accelerator | 4-dimethyl-aminopyridine | q.s. | q.s. | q.s. |
| Performance | $T_g$(DSC)/° C. | 180 | 156 | 168 |
| | Td(5% loss) | 392 | 398 | 399 |
| | CTE | 1.90% | 2.50% | 2.30% |
| | $D_k$(10 GHZ) | 3.82 | 3.7 | 3.6 |
| | $D_f$(10 GHZ) | 0.0064 | 0.005 | 0.006 |
| | PCT water absorption | 0.22% | 0.21% | 0.20% |
| | PCT | 2/3 | 0/3 | 0/3 |
| | Phase separation | Yes | No | No |
| | Toughness | Δ | ○ | ○ |

Note: based on parts by weight of solid components.

The materials listed in Tables 1 and 2 are stated as follows specifically.

A1: Epoxy resin synthesized in Preparation Example 1
A2: Epoxy resin synthesized in Preparation Example 2
A3: Epoxy resin containing naphthalene ring, dicyclopentadiene ring and imide structures
NC-3000H: Biphenyl phenolic epoxy resin (Product from Nippon Kayaku, having an epoxy equivalent of 288 g/eq)
7200-3H: dicyclopentadiene novolac epoxy resin (product form DIC, having an epoxy equivalent of 285 g/eq)
HPC-8000-65T: active ester crosslinking agent (Product from DIC, having an ester equivalent 223 g/eq)
EF40: styrene-maleic anhydride (Product from Sartomer, having an anhydride equivalent of 260 g/eq)
2812: linear novolac resin (Product from Momentive, having a hydroxyl equivalent of 105 g/eq)
4-dimethylaminopyridine: accelerator (Product from Guangrong Chemical)

The aforesaid properties are tested by the following methods.

(1) Glass transition temperature (Tg): tested by the DSC method under IPC-TM-6502.4.25 in accordance with Differential scanning calorimetry (DSC).
(2) Dielectric constant and dielectric loss factor: tested by the method under IPC-TM-650 2.5.5.9 at a testing frequency of 10 GHz.
(3) PCT-post dip-soldering resistance evaluation: etching copper foils on the surface of copper clad laminates to evaluate the substrate; placing the substrate in a press pan to treat at 120° C. and 105 KPa for 2 h; then impregnating in a tin furnace at 288° C.; recording the corresponding time when the substrate is delaminated and bursted; when there is no bubble or lamination when the substrate is placed in the tin furnace for over 5 min, the evaluation will be ended. If there is bubble or delamination in 0, 1, 2, 3 sheets, it will be recorded as 0/3, 1/3, 2/3 and 3/3.
(4) Falling dart impact toughness: using the falling Dart Impact tester having a drop height of 40 cm and a falling dart weight of 1 Kg, to evaluate the toughness: if the cross is clear, it shows a better toughness represented by the symbol ⊚; if the cross is vague, it shows a worse toughness and a great brittleness represented by the symbol Δ; if the cross is between clarity and vague, it shows that the product has a general toughness represented by the symbol ○.

Analyses on Physical Properties

According to the physical properties in Tables 1 and 2, it can be seen that, active esters are used in the Comparison Examples to cure biphenyl epoxy resin and dicyclopentadiene epoxy resin, the product has an excellent dielectric performance, a low water absorption, and a lower glass transition temperature. In Comparison Example 1, the epoxy resin containing naphthalene ring, dicyclopentadiene ring and imide structures has a high glass transition temperature, but a worse solubility, and is easy to have phase separation and great brittleness. After adding the imide-modified epoxy resin of the present invention, the cured products in the Examples have not only a high glass transition temperature, a good toughness and PCT moisture proof, but also excellent dielectric properties.

As stated above, the epoxy circuit boards of the present invention have a high glass transition temperature, a low dielectric constant, a low dielectric loss factor, a high moisture and heat resistance, a high toughness and a good processability, as compared with common laminates.

The aforesaid examples are only the better examples of the present invention. Those ordinarily skilled in the art can make various corresponding changes and modifications according to the technical solution and technical concept of the present invention. Moreover, all these changes and modifications shall fall within the protection scope of the claims of the present invention.

The applicant declares that, the present invention discloses the detailed method of the present invention by the aforesaid examples, but the present invention is not limited by the detailed method, i.e. it does not mean that the present invention cannot be fulfilled unless the aforesaid detailed method is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. An epoxy resin composition, characterized in comprising (A) imide-modified epoxy resin;

(B) crosslinking agent;

wherein the imide-modified epoxy resin is an epoxy resin having formula (1) and/or (2),

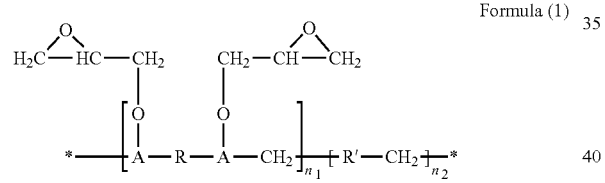

Formula (1)

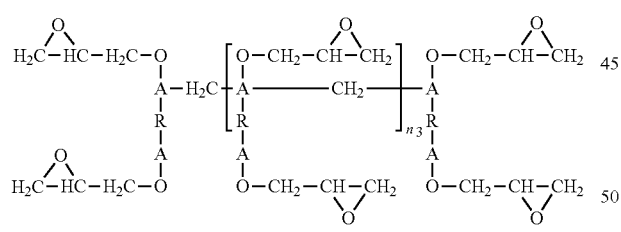

Formula (2)

A in Formulae (1) and (2) is independently unsubstituted phenyl or C1-C4 alkyl-substituted phenyl; $n_1$, $n_2$ and $n_3$ all are independently integers which is greater than or equals to 1;

R in Formulae (1) and (2) is independently

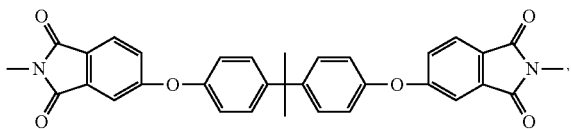

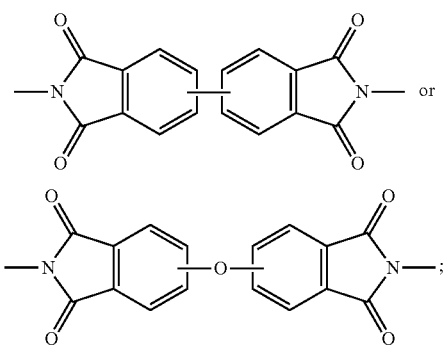

in Formula (1), R' is

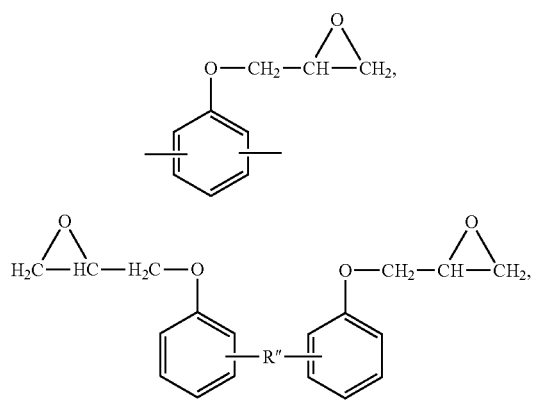

wherein R" is a single bond,

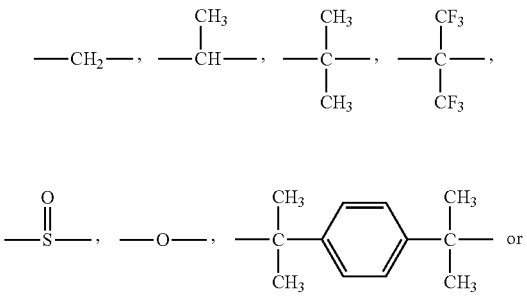

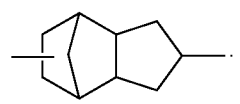

2. The epoxy resin composition as claimed in claim 1, characterized in that the imide-modified epoxy resin is an epoxy resin having formula (2).

3. The epoxy resin composition as claimed in claim 1, characterized in that the imide-modified epoxy resin is an epoxy resin having the following structure

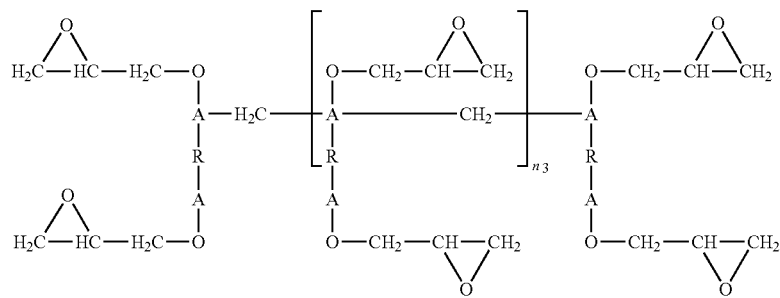

wherein A is phenyl; R is

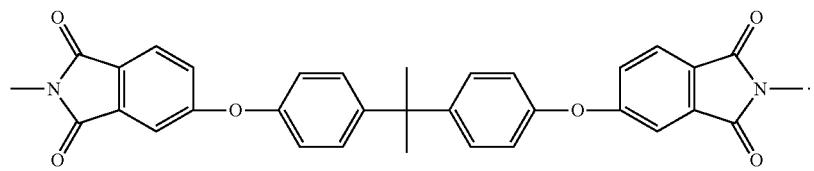

4. The epoxy resin composition as claimed in claim 1, characterized in that the crosslinking agent is any one selected from the group consisting of active esters, anhydride compounds, novolac resin, and a mixture of at least two selected therefrom.

5. The epoxy resin composition as claimed in claim 1, characterized in that the ratio of the epoxy equivalent of the imide-modified epoxy resin to the active group equivalent in the crosslinking agent is 1:0.9-1.1.

6. The epoxy resin composition as claimed in claim 1, characterized in that the epoxy resin composition further comprises a curing accelerator.

7. The epoxy resin composition as claimed in claim 1, characterized in that the epoxy resin composition further comprises a flame retardant.

8. The epoxy resin composition as claimed in claim 1, characterized in that the epoxy resin composition further comprises a filler which is an organic filler or/and inorganic filler.

9. The epoxy resin composition as claimed in claim 8, characterized in that the inorganic filler is any one selected from the group consisting of molten silica, crystalline silica, spherical silica, hollow silica, aluminium hydroxide, alumina, talc, aluminum nitride, boron nitride, silicon carbide, barium sulfate, barium titanate, strontium titanate, calcium carbonate, calcium silicate, mica, glass fiber powder, and a mixture of at least two selected therefrom.

10. The epoxy resin composition as claimed in claim 8, characterized in that the organic filler is any one selected from the group consisting of polytetrafluoroethylene powder, polyphenylene sulfide, polyether sulfone powder, and a mixture of at least two selected therefrom.

11. The epoxy resin composition as claimed in claim 8, characterized in that the filler is silica having a moderate particle size of 1-15 μm.

12. A prepreg comprising a reinforcing material and the epoxy resin composition as claimed in claim 1 and attached thereon after impregnation and drying.

13. A laminate comprising at least one prepreg as claimed in claim 12.

14. The epoxy resin composition as claimed in claim 1, characterized in that the crosslinking agent is active esters or/and anhydride compounds.

15. The epoxy resin composition as claimed in claim 14, characterized in that the crosslinking agent is active esters having the following structure:

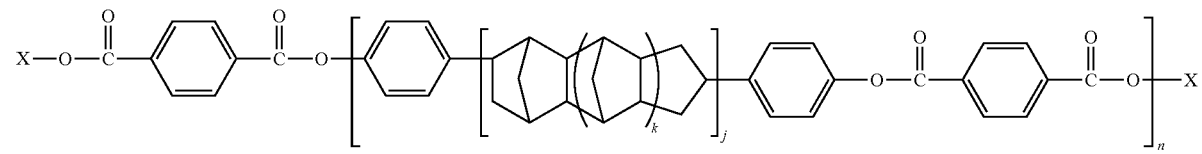

wherein X is phenyl or naphthyl; j is 0 or 1; k is 0 or 1; n represents a repeating unit of 0.25-1.25.

16. The epoxy resin composition as claimed in claim 6, characterized in that the curing accelerator is added in an amount of 0.05-1 part by weight, based on the sum of the addition amounts of components (A) and (B) which is 100 parts by weight.

17. The epoxy resin composition as claimed in claim 6, characterized in that the curing accelerator is any one selected from the group consisting of 4-dimethylaminopyridine, 2-methylimidazol, 2-methyl-4-ethylimidazol, 2-phenylethylimidazol, and a mixture of at least two selected therefrom.

18. The epoxy resin composition as claimed in claim 7, characterized in that the flame retardant is a bromine-containing flame retardant or/and a halogen-free flame retardant.

19. The epoxy resin composition as claimed in claim 7, characterized in that the flame retardant is added in an amount of 5-50 parts by weight, based on the sum of the addition amounts of components (A) and (B) which is 100 parts by weight.

20. The epoxy resin composition as claimed in claim 18, characterized in that the bromine-containing flame retardant is any one selected from the group consisting of decabrominated diphenyl ethane, brominated polystyrene, ethylene bis-tetrabromo phthalimide, bromine-containing epoxy resin, and a mixture of at least two selected therefrom.

21. The epoxy resin composition as claimed in claim 18, characterized in that the halogen-free flame retardant is any one selected from the group consisting of tri(2,6-dimethylphenyl)phosphine, 10-(2,5-dihydroxyphenyl)-9,10-dihydro-9-oxa-10-pho sphaphenanthrene- 10-oxide, 2,6-di-(2,6-dimethylphenyl)-phosphinobenzene, 10-phenyl-9,10-dihydro-9-oxa-10-phosphaphenanthrene-10-oxide, phenoxyphosphazene compound, zinc borate, nitrogen and phosphorus-based intumescent flame retardant, organic polymer flame retardant, phosphorous-containing novolac resin, phosphorous-containing bismaleimide, and a mixture of at least two selected therefrom.

22. The epoxy resin composition as claimed in claim 8, characterized in that the filler is added in an amount of 0-100 parts by weight, excluding 0, based on the sum of the addition amounts of components (A) and (B) which is 100 parts by weight.

\* \* \* \* \*